(12) United States Patent  
Adachi et al.

(10) Patent No.: US 9,087,620 B2  
(45) Date of Patent: Jul. 21, 2015

(54) BRAID AND WIRE HARNESS

(71) Applicant: Yazaki Corporation, Tokyo (JP)

(72) Inventors: Hideomi Adachi, Kosai (JP); Yoshiaki Ozaki, Kosai (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 14/250,639

(22) Filed: Apr. 11, 2014

(65) Prior Publication Data

US 2014/0216805 A1  Aug. 7, 2014

Related U.S. Application Data

(63) Continuation of application No. PCT/JP2012/076869, filed on Oct. 11, 2012.

(30) Foreign Application Priority Data

Oct. 11, 2011 (JP) .................................. 2011-223574

(51) Int. Cl.
  *H05K 9/00* (2006.01)
  *H01B 9/02* (2006.01)
  *H01B 7/18* (2006.01)
  *H01B 7/22* (2006.01)
  *B60R 16/02* (2006.01)

(52) U.S. Cl.
  CPC ............ *H01B 9/024* (2013.01); *B60R 16/0215* (2013.01); *H01B 7/182* (2013.01); *H01B 7/228* (2013.01); *H05K 9/0098* (2013.01)

(58) Field of Classification Search
  CPC .............................. H05K 9/0098; H01B 7/228
  See application file for complete search history.

(56) References Cited

U.S. PATENT DOCUMENTS

| 4,684,762 A | * | 8/1987 | Gladfelter ...................... 174/36 |
| 5,209,964 A | * | 5/1993 | Nakagawa .................. 428/35.3 |
| 2002/0195260 A1 | * | 12/2002 | Marks .......................... 174/35 R |
| 2003/0119351 A1 | | 6/2003 | Miyazaki et al. |
| 2004/0235381 A1 | * | 11/2004 | Iwasaki et al. ................ 442/190 |
| 2009/0120681 A1 | * | 5/2009 | Matsuzaki .................... 174/350 |
| 2009/0145655 A1 | * | 6/2009 | Gladd et al. .................. 174/378 |

(Continued)

FOREIGN PATENT DOCUMENTS

| GB | 724451 A | 2/1955 |
| JP | 2003-197037 A | 7/2003 |
| JP | 2011-189089 A | 9/2011 |

OTHER PUBLICATIONS

International Search Report (PCT/ISA/210), dated Jan. 30, 2013, issued by the International Searching Authority in counterpart International Patent Application No. PCT/JP2012/076869.

(Continued)

*Primary Examiner* — Hung V Ngo  
(74) *Attorney, Agent, or Firm* — Sughrue Mion, PLLC

(57) ABSTRACT

A braid for a wire harness includes a plurality of element wire bundles, each of which is formed of a plurality of element wires, and the plurality of element wire bundles being braided into a tubular shape. Each of the plurality of element wire bundles includes a metal element wire that has electrical conductivity, a plurality of resin element wires that have abrasion resistance and that are disposed to surround the metal element wire, and a drain metal element wire that has electrical conductivity and that is disposed with the resin element wires and contacts with the metal element wire. The drain metal element wires in the plurality of element wire bundles contact to each other.

5 Claims, 3 Drawing Sheets

(56) References Cited

U.S. PATENT DOCUMENTS

| | | | |
|---|---|---|---|
| 2010/0126752 A1* | 5/2010 | Watanabe | 174/102 D |
| 2010/0212952 A1* | 8/2010 | Abdelmoula et al. | 174/390 |
| 2012/0312595 A1* | 12/2012 | Sawada et al. | 174/72 A |
| 2013/0020122 A1* | 1/2013 | Su et al. | 174/350 |

OTHER PUBLICATIONS

Written Opinion (PCT/ISA/237), dated Jan. 30, 2013, issued by the International Searching Authority in counterpart International Patent Application No. PCT/JP2012/076869.

* cited by examiner

BRAID AND WIRE HARNESS

CROSS REFERENCE TO RELATED APPLICATIONS

This application is a continuation of PCT application No. PCT/JP2012/076869, which was filed on Oct. 11, 2012 based on Japanese Patent Application (No. 2011-223574) filed on Oct. 11, 2011, the contents of which are incorporated herein by reference.

BACKGROUND OF THE INVENTION

1. Field of the Invention

The present disclosure relates to a wire harness which is installed in a vehicle and a braid which constructs the wire harness.

2. Description of the Related Art

A wire harness disclosed in JP-A-2003-197037 includes a plurality of electric wires and a braid which collectively covers the plurality of electric wires. The braid is formed into a tubular shape by using a lot of extra fine metal element wires that have electrical conductivity and braiding these element wires.

The braid is provided to exert an electromagnetic shielding function for the plurality of electric wires.

SUMMARY OF THE INVENTION

The braid is intended to exert the electromagnetic shielding function as mentioned above, and the braid itself does not have enough abrasion resistance or impact resistance. Therefore, it is necessary to provide an outer covering member outside the braid in accordance with the installation position of the wire harness.

When the outer covering member is provided, the number of components that construct the wire harness is increased. The weight and the cost are also increased with the increase of the number of components.

The present disclosure is made in view of the above described circumstances, and the object of the present disclosure is to provide a braid that has the function of an outer covering member as well as an electromagnetic shielding function. Further, another object of the present disclosure is to provide a wire harness including the braid.

In order to achieve the above object, according to the present invention, there is provided a braid comprising:

a plurality of element wire bundles, each of which is formed of a plurality of element wires, and the plurality of element wire bundles being braided into a tubular shape, wherein each of the plurality of element wire bundles includes a metal element wire that has electrical conductivity and serves as a core wire of each of the element wire bundles, a plurality of resin element wires that have abrasion resistance and that are disposed to surround the metal element wire, and a drain metal element wire that has electrical conductivity and that is disposed with the resin element wires and contacts with the metal element wire; and wherein the drain metal element wires in the plurality of element wire bundles contact to each other.

According to the above configuration, while an electromagnetic shielding function is exerted by the part including the metal element wire and the drain metal element wire, at least abrasion resistance is secured by the part including the resin element wires. The resin element wires may have impact resistance as well as abrasion resistance. Further, according to the present disclosure, because the resin element wires are disposed to surround the metal element wire, the influence of rub (abrasion) or impact will be received by the resin element wires. That is, it becomes hard for the influence of rub (abrasion) or impact to reach the metal element wire, and the electromagnetic shielding function is well maintained.

For example, each of the metal element wire, the resin element wires and the drain metal element wire is formed of a single thread or a plurality of twisted threads.

According to the above configuration, for example, when the resin element wire is made of a single thread, it becomes possible that the braid possesses elasticity. The area of the whole cross section increases and the abrasion resistance can be improved. On the other hand, when the resin element wire is made a plurality of twisted threads, each of the twisted threads becomes thinner and it becomes possible that the braid possesses flexibility. If the braid has flexibility, the followability of the braid is improved and the impact resistance can be improved.

For example, the resin element wires and the drain metal element wire are twisted with the metal element wire which serves as the core wire of each of the element wire bundles.

According to the above configuration, variation in the arrangement of the element wires can be controlled by twisting. Further, in the element wire bundles at the time of forming the braid, the contact between the drain metal element wires can be easy.

For example, the resin element wires are colored with a recognition color of a high voltage system.

According to the present disclosure that has such a feature, what is a braid used for a high voltage system is recognized at first sight, and it is not necessary to provide an additional member for recognition when the wire harness is used.

According to the present disclosure, there is also provided a wire harness comprising:

the braid according to any one of the above described configurations; and one or a plurality of high voltage electrical conductive paths covered by the braid.

According to the above configuration, the braid, which covers one or a plurality of high voltage electrical conductive paths, of the wire harness possesses the function of an outer covering member as well as an electromagnetic shielding function, and an exclusive outer covering member is unnecessary.

According to the above configurations, because the three kinds of element wires, namely, the metal element wire, the resin element wire and the drain metal element wire, are included, an effect is achieved that it is possible to provide a braid which has the function of an outer covering member as well as an electromagnetic shielding function. According to the present disclosure, because the resin element wires are disposed to surround the outside of the metal element wire, an effect is achieved that it can be hard for the influence of rub (abrasion) or impact to reach the metal element wire. According to the present disclosure, an effect is achieved that an electromagnetic shielding function can be maintained even if the above influence reaches the braid.

According to the above disclosure, because each of the metal element wire, the resin element wires and the drain metal element wire is formed of a single thread or a plurality of twisted threads, an effect is achieved that the braid can possess elasticity or the braid can possess flexibility. An effect is achieved that the abrasion resistance or the impact resistance can be improved. According to the present disclosure, an effect is achieved that the braid can be made to conform to the purpose.

According to the above configuration, because the resin element wires and the drain metal element wire are twisted with the metal element wire which serves as the core wire, effects are achieved that variation in the arrangement of the element wires can be controlled, and in the element wire bundles at the time of forming the braid, the drain metal drains can be electrically connected by ensuring the contact between the drain metal element wires. Therefore, according to the present disclosure, an effect is achieved that functions can be maintained.

According to the above configuration, because the resin element wires are colored with a recognition color for a high voltage system, an effect is achieved that what is a braid used for a high voltage system can be recognized at first sight even without providing an additional member for recognition.

According to the above configuration, because the braid, which covers one or a plurality of high voltage electrical conductive paths, possesses the function of an outer covering member as well as an electromagnetic shielding function, an effect is achieved that the increase of the number of components of the wire harness can be inhibited. Thereby, an effect is achieved that the weight increase and the cost increase of the wire harness can be inhibited.

BRIEF DESCRIPTION OF THE DRAWINGS

FIG. 1A is a schematic block diagram of a vehicle which shows that the wire harness is arranged, and FIG. 1B is a figure which shows the construction of the braid and the wire harness.

FIG. 2A is an enlarged perspective view of the terminal part, and FIG. 2B is a sectional view of an element wire bundle that constructs the braid.

DETAILED DESCRIPTION OF THE EXEMPLARY EMBODIMENTS

A braid that covers one or a plurality of high voltage electrical conductive paths has the function of an outer covering member as well as an electromagnetic shielding function. In order to have the electromagnetic shielding function and the function of the outer covering member, the braid has the following three types of element wires that construct the braid. That is, the braid includes three kinds of element wires, namely, a metal element wire that has electrical conductivity and serves as a core wire, a plurality of resin element wires that have abrasion resistance and that are disposed to surround the metal element wire, and a drain metal element wire that has electrical conductivity and that is disposed with the resin element wires and contacts with the metal element wire.

The braid is formed by braiding a lot of element wire bundles so that the drain metal element wires in the element wire bundles contact to each other.

Figure 1A:
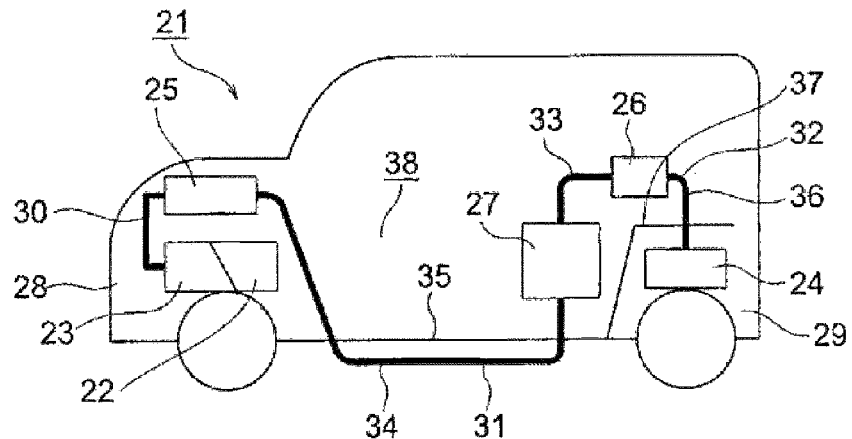
FIGS. 1A and 1B are views showing a braid and a wire harness of the present disclosure.
Figure 1B:
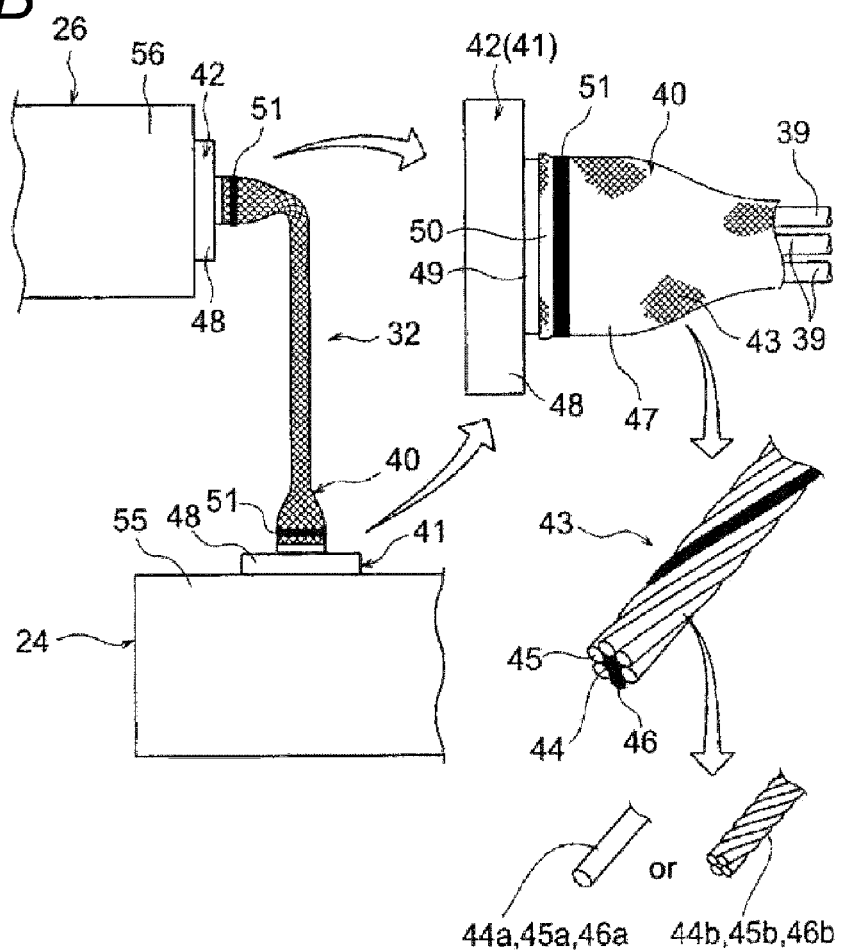
Figure 2A:
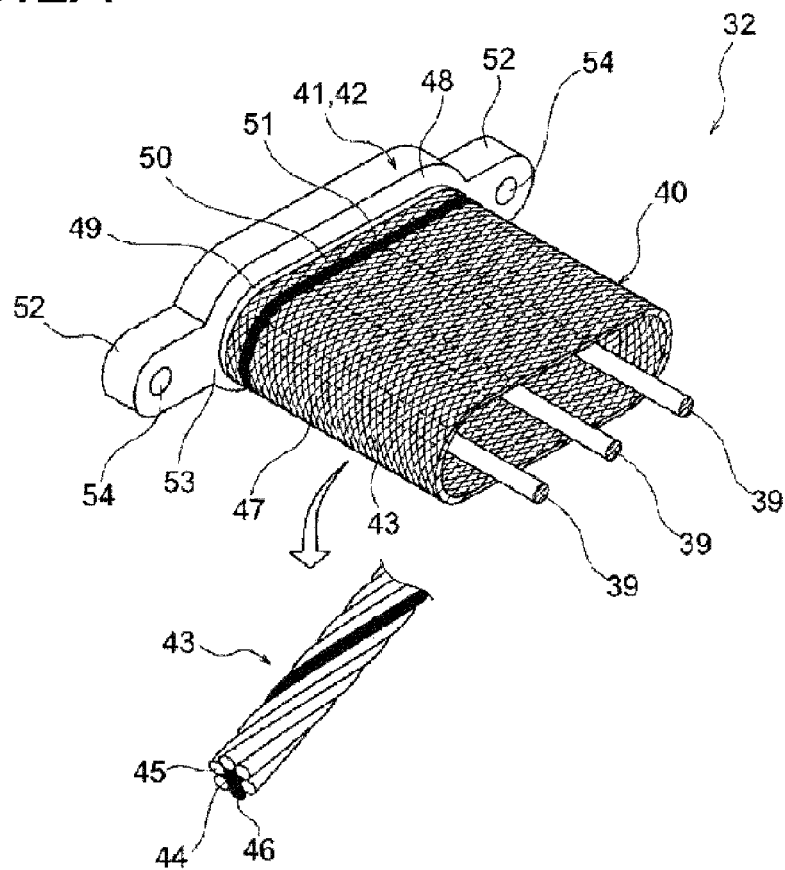
FIGS. 2A and 2B are views showing a terminal part of the braid and the wire harness.
Figure 2B:
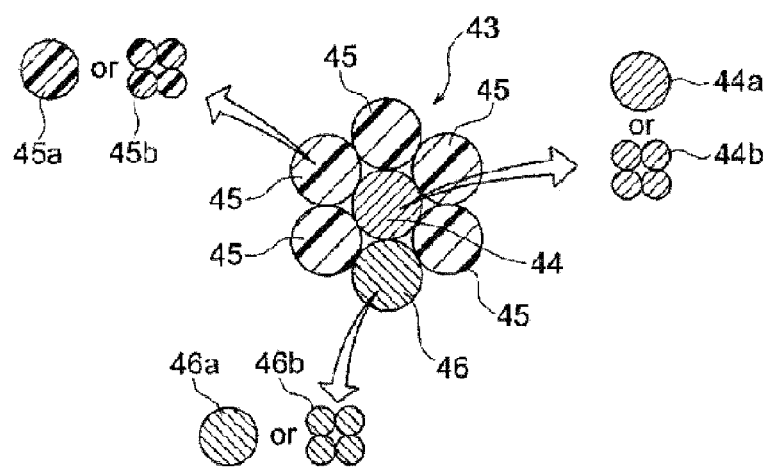
Figure 3:
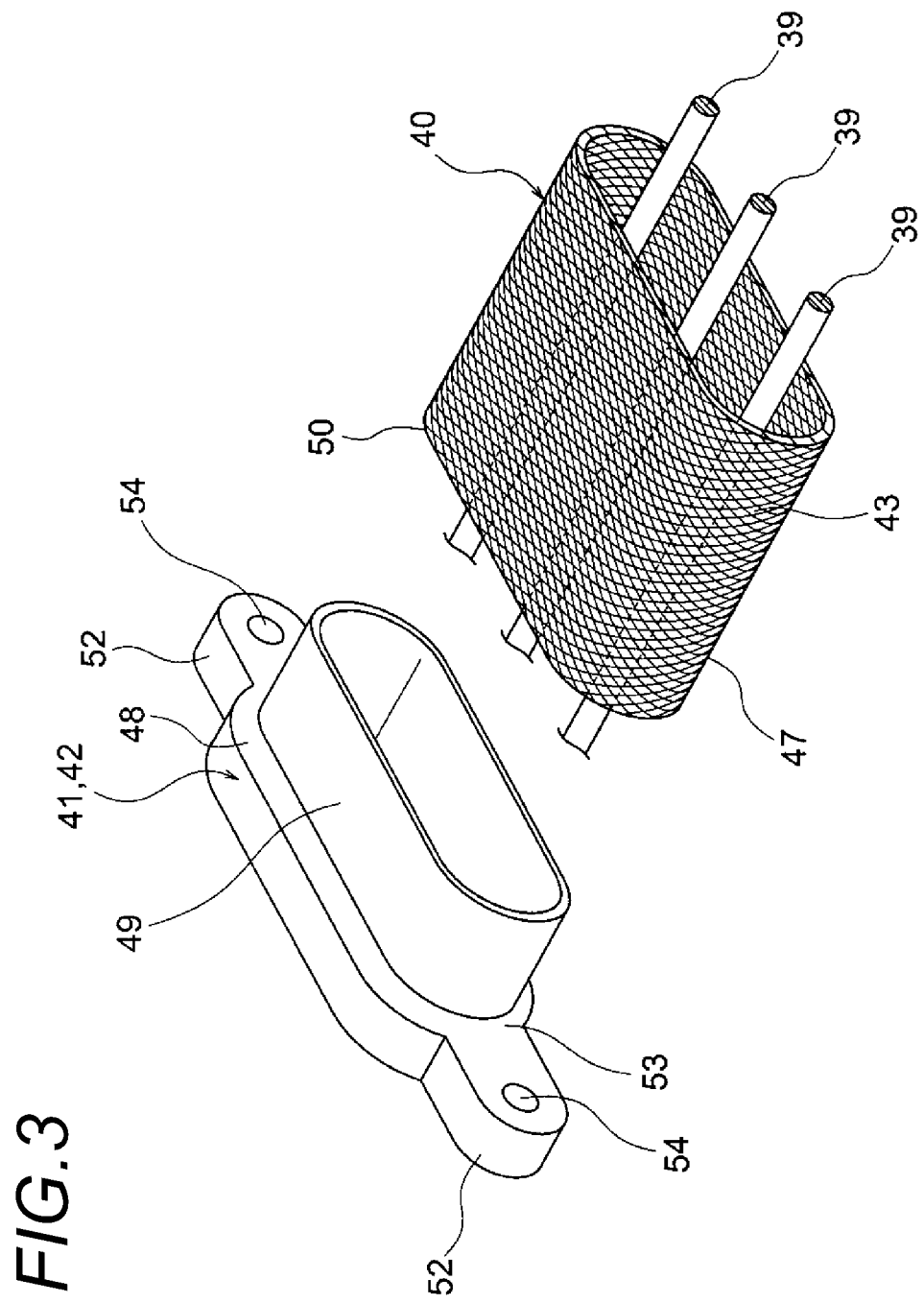
FIG. 3 is an exploded perspective view of the terminal part of the braid and the wire harness.

An embodiment will be described with reference to the figures. FIGS. 1A and 1B are views showing a braid and a wire harness of the present disclosure. FIGS. 2A, 2B and 3 are views showing a terminal part of the braid and the wire harness.

In the embodiment, an example in which a shielding structure and a wire harness of the present disclosure are applied to a hybrid vehicle (it may be an electric vehicle) is given and described.

In FIG. 1A, a reference number 21 shows a hybrid vehicle. The hybrid vehicle 21 is a vehicle which is driven by an engine 22, a front motor unit 23 and a rear motor unit 24 together, and electric power from a battery 27 (battery pack, battery assembly) is adapted to be supplied to the front motor unit 23 through a front inverter unit 25 and to the rear motor unit 24 through a rear inverter unit 26. The engine 22, the front motor unit 23 and the front inverter unit 25 are installed in an engine room 28 at the position of front wheels and the like in the embodiment. The rear motor unit 24, the rear inverter unit 26 and the battery 27 are installed in a vehicle rear part 29 of rear wheels and the like (The installation positions shall be an example. The position of the battery 27 shall not be particularly limited as long as the battery 27 can be used in the hybrid vehicle 21 or an electric vehicle).

The front motor unit 23 and the front inverter unit 25 are connected by a high voltage wire harness 30. The front inverter unit 25 and the battery 27 are also connected by a high voltage wire harness 31. The rear motor unit 24 and the rear inverter unit 26 are also connected by a high voltage wire harness 32. The rear inverter unit 26 and the battery 27 are also connected by a high voltage wire harness 33.

A middle part 34 of the wire harness 31 is arranged at the ground side of a vehicle body floor 35. The wire harness 31 is arranged in substantially parallel with the vehicle body floor 35. The vehicle body floor 35 is a well-known body and is a so-called panel member, and through hole (The reference numbers are omitted.) are formed at predetermined positions. The through holes become parts to which the wire harness 31 is inserted.

The wire harness 32 is arranged so that a middle part 36 of the wire harness 32 penetrates through a vehicle body floor 37 in the vehicle rear part 29. A through hole into which the wire harness 32 is inserted is formed like the through hole of the wire harness 31. A reference number 38 indicates an indoor part.

Because the wire harness 30 is connected to the front motor unit 23 and the wire harness 32 is connected to the rear motor unit 24, the wire harness 30 and the wire harness 32 may be called a motor cable or a motor cable device.

The present disclosure is described as follows by using the wire harness 32 as an example. The present disclosure can be applied to not only the wire harness 32, but also the wire harness 30, 31 and 33.

In FIG. 1B, the wire harness 32 includes three high voltage electric wires 39 (electrical conductive paths), a braid 40 which collectively covers and shields the three high voltage electric wires 39, a motor side connecting part 41 which is provided at one end of the high voltage electric wires 39 and an inverter side connecting part 42 which is provided at the other end. Unlike the related wire harness, the wire harness 32 is constructed without an outer covering member. For this reason, the braid 40 possesses abrasion resistance and impact resistance and functions as an outer covering member (The details are to be described below).

In FIGS. 1B, 2A and 2b, the high voltage electric wire 39 is a high voltage electrical conductive path including a conductor and an insulator (cover), and is formed to have a length that is necessary for electrical connection. The conductor is made of copper, copper alloy, aluminum or aluminum alloy. The conductor may be either a conductor structure in which element wires are twisted or a rod-like conductor structure whose cross section is a rectangular shape or a round shape (for example, a conductor structure with a rectangular single core or a round single core, and in this case, the electric wire itself becomes rod-like).

The high voltage electric wires 39 are used in the present embodiment, but this disclosure shall not be limited to this. That is, it is also possible to provide an insulator to a well-known bus bar to be used as a high voltage electrical conductive path.

The braid 40 is a pipe-like electromagnetic shielding member (a braided shielding member for electromagnetic wave measures), and is formed into such a shape that the three high voltage electric wires 39 in the embodiment can be covered across the full length. The braid 40 is provided to exert an electromagnetic shielding function for the three high voltage electric wires 39. A part of the element wires that construct the braid 40 has abrasion resistance and impact resistance. Thus, the braid 40 would have the function of an outer covering member due to these characteristics. The braid 40 is described in more detail as follows.

The braid 40 is formed by using a plurality of element wire bundles 43, each of which is formed of a bundle of a plurality of extra fine element wires, and braiding the element wire bundles into a tubular shape. The braid 40 is formed by braiding the element wire bundles 43 so that the element wire bundles are arranged in parallel in the peripheral direction, and braiding the element wire bundles 43 to be intersected. In the embodiment, the braid 40 is formed by braiding the element wire bundles 43 so that stitches (not shown in the figure) formed of intersected element wire bundles 43 become small.

Three kinds of element wires, a metal element wire 44 made of metal that has electrical conductivity, a resin element wire 45 made of synthetic resin that has abrasion resistance, and a drain metal element wire 46 made of metal that has electrical conductivity, are used as element wires that construct the element wire bundle 43. The three kinds of element wires, the metal element wire 44, the resin element wire 45 and the drain metal element wire 46, are used to be mixed in the element wire bundle 43 in predetermined numbers.

The metal element wire 44 is disposed at a position to become the core wire of the element wire bundle 43. A plurality of resin element wires 45 are disposed to surround the metal element wire 44. The drain metal element wire 46 is disposed together with the plurality of resin element wires 45, and is disposed to contact with the metal element wire 44.

The metal element wire 44 may include, as an example, a metal fiber which is an annealed copper wire. As illustrated in FIG. 1B, the metal fiber may be a single thread 44a or a plurality of twisted threads 44b. Also, the resin element wire 45 may include, as an example, resin fiber which includes PET resin. Also, the resin fiber may be a single thread 45a or a plurality of twisted threads 45b. Like the metal element wire 44, the drain metal element wire 46 may include, as an example, a metal fiber which is an annealed copper wire. The metal fiber may be a single thread 46a or a plurality of twisted threads 46b.

The element wire bundle 43, which is a bundle of the above element wires, is formed by making the metal element wire 44 serves as a core wire, and twisting the plurality of resin element wires 45 and the drain metal element wire 46 around the core wire. The element wire bundle 43 of the present embodiment is formed by twisting like a rope (This shall be an example).

The element wire bundle 43 is not limited in the presence/absence of the twisting as long as the drain metal element wire 46 comes in contact with the metal element wire 44 and the drain metal element wire 46 is exposed outwards. As illustrated in FIG. 2B, the metal fiber for the metal element wire 44 may include a plurality of non-twisted threads 44b, the resin fiber for the resin element wire 45 may include a plurality of non-twisted threads 45b, and the metal fiber for the drain metal element wire 46 may include a plurality of no-twisted threads 46b. Likewise, the element wire bundle 43 is not limited in the presence/absence of the twisting as long as the metal element wire 44 is protected by the plurality of resin element wires 45.

The resin element wires 45 are colored to a recognition color related to high voltage (This shall be an example). In particular, the resin element wires 45 are colored to orange using pellets. This is because the wire harness 32 is a high voltage wire harness. There is further a recognition method which winds an orange tape partially around the periphery of the braid 40. It is cheap to wind the tape.

Terminal parts 47, which are one end and the other end of the above braid 40, are fixed with an appropriate method to metal shells 48 of the motor side connecting part 41 and the inverter side connecting part 42. In the embodiment, the terminal parts 47 are fixed with welding (This shall be an example). In particular, as shown in FIG. 3, the terminal part 47 is fixed by inserting an end 50 of the braid 40 into a body cylindrical part 49 of the metal shell 48 from outside, and after the insertion, welding the periphery of the end 50 on the outer surface of the body cylindrical part 49. A reference number 51 of FIGS. 1B and 2 shows a welded part. The welded part 51 is formed to circle around the outside surface of the body cylindrical part 49.

The welded part 51 is not limited to circle around the outside surface of the body cylindrical part 49, it is also possible to weld partially in the peripheral direction. Further, the welding position is not limited to the outer surface of the body cylindrical part 49, but may be a planar part 53 of a fixed part 52 (refer to FIG. 3). A planar part which is placed between the base end of the body cylindrical part 49 and through holes 54 of the fixed member 52 may correspond to the planar part 53.

Other than the welding, a fixing method which crimps with a well-known shield ring or a fixing process with insert molding may be applied.

The metal shell 48 is provided as a metal component that has electrical conductivity. The metal shells 48 are adapted to make the braid 40 to be able to be electrically connected when the metal shells 48 are fixed (with bolts) to shield cases 55 and 56.

As described with reference to FIGS. 1A to 3, the braid 40 of the present disclosure is used in the wire harness 32 which is arranged in the hybrid vehicle 1. A number of element wire bundles 43 are braided into a tubular shape. The braid 40 includes three kinds of element wires, namely, the metal element wire 44 made of metal that has electrical conductivity, the plurality of resin element wires 45 made of synthetic resin which has abrasion resistance and the like, and the drain metal element wire 46 made of metal that has electrical conductivity. While an electromagnetic shielding function is exerted by the part including the metal element wire 44 and the drain metal element wire 46, abrasion resistance and impact resistance are secured by the part including the resin element wires 45. Therefore, an effect is achieved that the braid 40 according to the present disclosure, unlike the traditional example, has the function of an outer covering member as well as an electromagnetic shielding function.

Because in the braid 40 according to the present disclosure, each of the element wires that construct the element wire bundle 43 may include a single thread (44a, 45a or 46a) or a plurality of twisted threads (44b, 45b or 46b), the following effects are achieved. That is, for example, when the resin element wire 45 includes a single thread 45b, an effect is achieved that the braid 40 can possess elasticity, and because the area of the whole cross section is increased, an effect is achieved that the abrasion resistance can be improved. On the other hand, when the resin element wire 45 includes a plurality of twisted threads 45b, each of the twisted threads 45b become thinner, and as a result, effects are achieved that the braid 40 can possess flexibility, and that the impact resistance can be improved since the followability of the braid is improved due to the flexibility. In addition, since the resin element wire 45 may include a single thread 45a or a plurality of twisted threads 45b, an effect is achieved that the braid can be made to conform to the purpose.

Because in the braid 40 according to the present disclosure, the plurality of resin element wires 45 are disposed to surround the outside of the metal element wire 44 that becomes the core wire of the element wire bundle 43, an effect is achieved that the influence of rub (abrasion) or impact can be received by the resin element wires 45. That is, it becomes hard for the influence of rub (abrasion) or impact to reach the metal element wire 44, and as a result, an effect is achieved that the electromagnetic shielding function can be well maintained.

Because in the braid 40 according to the present disclosure, the metal element wire 44 becomes a core wire and the plurality of resin element wires 45 and the drain metal element wire 46 are twisted around the core wire, an effect is achieved that variation in the arrangement of the element wires can be controlled in the element wire bundle 43. Because the plurality of resin element wires 45 and the drain metal element wire 46 are twisted around the core wire, an effect is achieved that in the element wire bundles 43 at the time of forming the braid 40, the drain metal drains 46 can be electrically connected by ensuring the contact between the drain metal element wires 46. Therefore, according to the present disclosure, an effect is achieved that functions can be maintained.

Because in the braid 40 according to the present disclosure, the resin element wires 45 that construct the element wire bundle 43 are colored with a recognition color (orange) for a high voltage system, an effect is achieved that what is a braid 40 or a wire harness 32 used for a high voltage system can be recognized at first sight even without providing an additional member for recognition.

Because in the wire harness 32 according to the present disclosure, the braid 40, which covers the plurality of high voltage electric wires 39, possesses the function of an outer covering member as well as an electromagnetic shielding function, effects are achieved that the increase of the number of components of the wire harness 32 can be inhibited, and that the weight increase and the cost increase can be inhibited.

It is apparent that various modifications can be made to the invention without changing the purpose of the invention.

The braid can have the function of an outer covering member as well as an electromagnetic shielding function, and a wire harness including the braid can be provided.

What is claimed is:

1. A braid for a wire harness comprising:
   a plurality of element wire bundles, each of which is formed of a plurality of element wires, and the plurality of element wire bundles being braided into a tubular shape,
   wherein each of the plurality of element wire bundles includes a metal element wire that has electrical conductivity and serves as a core wire of each of the element wire bundles, a plurality of resin element wires that have abrasion resistance and that are disposed to surround the metal element wire, and a drain metal element wire that has electrical conductivity and that is disposed with the resin element wires and contacts with the metal element wire; and
   wherein the drain metal element wires in the plurality of element wire bundles contact to each other.

2. The braid according to claim 1, wherein each of the metal element wire, the resin element wires and the drain metal element wire is formed of a single thread or a plurality of twisted threads.

3. The braid according to claim 1, wherein the resin element wires and the drain metal element wire are twisted with the metal element wire which serves as the core wire of each of the element wire bundles.

4. The braid according to claim 1, wherein the resin element wires are colored with a recognition color of a high voltage system.

5. A wire harness comprising:
   the braid according to claim 1; and
   one or a plurality of high voltage electrical conductive paths covered by the braid.

* * * * *